| United States Patent [19] | [11] Patent Number: 5,773,315 |
|---|---|
| Jarvis | [45] Date of Patent: Jun. 30, 1998 |

[54] PRODUCT WAFER YIELD PREDICTION METHOD EMPLOYING A UNIT CELL APPROACH

[75] Inventor: Richard W. Jarvis, Austin, Tex.

[73] Assignee: Advanced Micro Devices, Inc.

[21] Appl. No.: 736,831

[22] Filed: Oct. 28, 1996

[51] Int. Cl.$^6$ ............................. H01L 21/66; G01R 31/26
[52] U.S. Cl. .................................................. 438/14; 438/16
[58] Field of Search ........................................ 438/14, 16

[56] References Cited

U.S. PATENT DOCUMENTS 3,751,647  8/1973  Maeder et al. ............................ 438/14
3,842,491  10/1974  Depuy et al. ............................. 438/14

*Primary Examiner*—Brian Dutton
*Attorney, Agent, or Firm*—Kevin L. Daffer; Conley, Rose & Tayon

[57] ABSTRACT

A method is presented for determining a predicted yield value for a silicon wafer subjected to a wafer fabrication process. The wafer fabrication process forms multiple integrated circuits (i.e., chips) upon a surface of the wafer. A unit cell region is chosen on the surface of the wafer and within the boundaries of a single chip. Two or more masking steps which form features within the selected unit cell region are chosen as critical masking steps. Portions of the unit cell region within which a given critical masking step forms features with minimum dimensions or spacings are identified as critical regions. A fraction of the unit cell region enveloped by critical regions is used to compute a critical chip area A' for the critical masking step. An electrical fault density D' is computed for each critical masking step as a product of an expected total defect density $D_t$ and a fraction of defects expected to result in catastrophic failures $f_c$. An estimated yield value is calculated for each critical masking step by substituting A' and D' for A and D, respectively, in a yield equation associated with an existing yield prediction model. A predicted yield Y' for the silicon wafer is computed as the product of the estimated yield values of the critical masking steps.

14 Claims, 11 Drawing Sheets

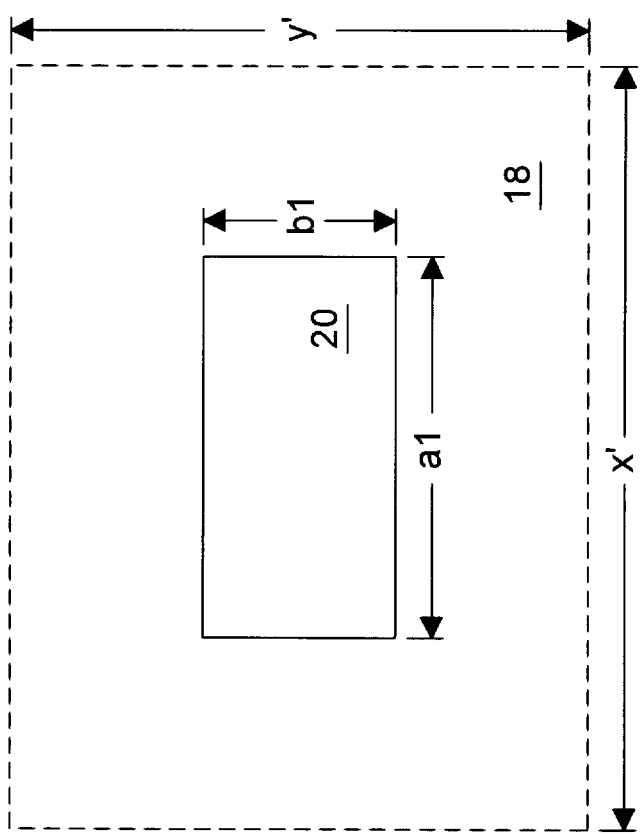

5,773,315

PRODUCT WAFER YIELD PREDICTION METHOD EMPLOYING A UNIT CELL APPROACH

BACKGROUND OF THE INVENTION

1. Field of the Invention

This invention relates to integrated circuit manufacturing and more particularly to yield prediction for product wafers manufactured using a given wafer fabrication process.

2. Description of the Relevant Art

High yields are essential to the profitable manufacture of integrated circuits. Yield prediction, used to estimate the manufacturing yield of a new integrated circuit, is accordingly a very valuable tool in assuring that such manufacture will be economically successful.

A wafer fabrication process typically forms multiple integrated circuits upon each of several silicon wafers processed simultaneously. As the integrated circuits formed on a given silicon wafer are identical copies of a given product, the silicon wafer is sometimes referred to as a product wafer. An individual integrated circuit is also called a "chip" or a "die". Following wafer fabrication, the dice are subjected to functional testing, then separated. Fully functional die are typically packaged and sold as individual units.

Due to the fact that each die is typically square or rectangular, and wafers are substantially round, some of the dice around the edges of each wafer are not complete (i.e., not whole). Such "edge die" are not expected to produce functional integrated circuits. As used herein, the term "yield" pertains to a ratio of the number of fully functional chips on a processed product wafer to the number of whole chips on the product wafer. This definition of yield is also known as "multiprobe yield" or "wafer sort yield". In general, the yield associated with a product wafer manufactured using a particular wafer fabrication process depends upon: 1) the number of steps in the wafer fabrication process, 2) the number of defects introduced during each processing step, and 3) the vulnerability of the features formed during a given processing step to the defects introduced during the processing step.

It is important to note that the above definition of yield does not include losses due to wafer breakage and warping, nor does it include losses due to process variations. During the course of a wafer fabrication process, wafers are handled many times both manually and by automatic systems. Wafers are sometimes broken during handling and must be rejected. Wafers become warped when heated and cooled during processing. As substantially flat surfaces are required for standard photolithographic patterning techniques, wafers warped beyond allowable limits must be discarded. In each processing step, parameters associated with structures formed on wafers vary from target values. Occasionally these parameters fall outside of acceptable limits, and affected wafers must be scrapped during the wafer fabrication process. In addition, a chip on a processed wafer may be able to perform an intended electrical function, but may not meet other specifications due to parametric variations. For example, the chip may dissipate too much power, or voltage transitions at output terminals may occur too slowly.

A defect is simply a flaw caused by an imperfect manufacturing process. Only some of the defects associated with a given step are "catastrophic" defects, or defects which prevent an integrated circuit containing the defect from performing its intended function. Many different yield prediction models have been developed assuming certain defect distributions over wafer surfaces. In all of the accepted models, yield is a function of chip area A and catastrophic defect density D. Chip area A is typically the entire surface area of the chip. Catastrophic defect density D is the number of catastrophic defects per unit of surface area of a wafer. Regression analysis is often performed upon actual yield data to determine which yield prediction model best fits a particular wafer fabrication process. See, W. R. Runyan et al., *Semiconductor Integrated Circuit Processing Technology*, Addison-Wesley Pub. Co., 1990, Chapt. 11, pp. 579–644 (incorporated herein by reference).

It is well known that most defects occur during microstructure patterning steps. Photolithography is used to accomplish such patterning steps, during which light passing through a pattern on a mask transfers the pattern to a layer of a light-sensitive material deposited on the surface of a silicon wafer. The layer of the light-sensitive material is developed in a manner analogous to the developing of exposed photographic film. Exposure to light makes certain regions of the layer of light-sensitive material soluble. The developing step removes the soluble regions, forming holes in the layer of light-sensitive material. Select regions of the upper surface of the silicon wafer are exposed to an etchant or to dopant atoms through the holes during a subsequent processing step. Small particles (i.e., particulates) on the surface of the mask or on the surface of the photoresist layer, which block or diffuse light, cause imperfect pattern registrations (i.e., imperfect feature formations). Particulates are present in the ambient air, introduced by processing personnel, suspended in liquids and gasses used during processing, and generated by processing equipment. In general, the vulnerability of a particular feature to a given defect is inversely proportional to the physical dimensions of the feature. Thus the smaller the physical dimensions of a feature formed using photolithography, the greater the likelihood that a particulate of a given size will cause a catastrophic defect.

The simplicity of many of the accepted yield prediction models limits their accuracy when applied to modern integrated circuits. For example, almost all of the accepted yield prediction models apply a single catastrophic defect density D to an entire chip area A. Many chips produced today, however, have several regions containing large numbers of features with common physical dimensions. Catastrophic defect density D is reasonably different for each region. The catastrophic defect density of a particular region is, in general, inversely proportional to the physical dimensions of features formed in the region as described above. It would thus be advantageous to have a more accurate yield prediction method which accounts for the fact that some regions of chips are more vulnerable to the introduction of defects than others.

SUMMARY OF THE INVENTION

The problems outlined above are in large part solved by an improved method of predicting the manufacturing yield of a silicon wafer subjected to a wafer fabrication process. The method accounts for the fact that some regions of chips are more vulnerable to the introduction of defects than others. The present method assumes that most yield-limiting defects are caused by particulate contaminants introduced during each of several photolithographic patterning steps (i.e., masking steps). First, a unit cell region is chosen upon the surface of the wafer and within the boundaries of a single chip. The selected unit cell region represents the process of forming features upon the entire surface of the chip. Several masking steps preferably form features with minimum dimensions or distances between features (i.e., spacings) within the unit cell region. Selection of such a unit cell region advantageously produces a conservative yield prediction. Two or more "critical" masking steps which form features within the unit cell region are selected from the set of all masking steps. Portions of the unit cell region within which a given critical masking step forms features with minimum dimensions or spacings are identified as critical regions. A fraction of the unit cell region enveloped by critical regions is used to compute a critical chip area A' for the critical masking step. An electrical fault density D' is computed for each critical masking step as a product of an expected total defect density $D_t$ and a fraction of defects expected to result in catastrophic failures $f_c$. An estimated yield value is calculated for each critical masking step by substituting A' and D' for A and D, respectively, in a yield equation associated with an existing yield prediction model. A predicted yield Y' for the silicon wafer is computed as the product of the estimated yield values of the critical masking steps.

A set of design rules for the wafer fabrication process specify a minimum physical dimension and a minimum spacing distance for features formed during each masking step of the process. There are two general types of critical regions which may exist within the unit cell region for each masking step. A first type of critical region exists where features formed during a given masking step have the minimum physical dimension established for that masking step. A second type of critical region exists where any two features formed during the masking step are separated by the minimum spacing distance established for that masking step. The sum of the areas enveloped by critical regions is used to determine a critical chip area A' for each masking step.

A unit cell model is a convenient representation of the section of a mask used to form one or more features within the selected unit cell region during a critical masking step. A unit cell model has an opaque region representing an opaque portion of the mask section and clear region representing a clear (i.e., light transmissive) portion of the mask section. A unit cell model has critical regions which correspond directly to critical regions within the unit cell region. A set of criteria based upon the design rules for the process is used to identify critical regions of the unit cell model. The critical chip area A' associated with a given masking step may be determined by the fraction of the corresponding unit cell model which is taken up by critical regions.

Several suitable yield prediction models exist which use values of chip area A and catastrophic defect density D to determine an estimated yield value. The present method prescribes substituting a computed critical chip area A' for chip area A, and a computed electrical fault density D' for catastrophic defect density D. One or more equations are generated for the masking step which express the relationships between critical chip area A', chip area A, characteristics of the unit cell model, the design rules for the process, and the characteristics of the mask. Characteristics of the unit cell model include identified critical regions. Characteristics of the mask include the fractions of the mask which are clear and opaque. Values associated with characteristics of the unit cell model and the mask, along with dimensions of features as formed (i.e., as printed) on the surface of the wafer, are substituted for appropriate variables in the one or more equations used to determine critical chip area A'. Critical chip area A' for a given critical masking step may always be calculated by: (i) identifying one or more critical regions of the corresponding unit cell model, (ii) determining the fraction of the unit cell model which is taken up by the one or more critical regions, and (iii) multiplying the fraction by chip area A. The fraction of the unit cell model which is taken up by the one or more critical regions is determined by dividing the sum of the areas of the critical regions by the area of the unit cell model. This is equivalent to dividing the sum of the areas of the corresponding critical regions of the unit cell region on the surface of the wafer by the area of the unit cell region. In some cases A' may be estimated using information as to the fractions of a corresponding mask which are opaque and clear.

Defects are introduced into features during depositions of layers of desired materials, and also during subsequent patterning steps. Patterning steps include masking steps and etch steps. Some fraction of the total number of defects introduced during depositions, masking steps, and etching steps are catastrophic. Electrical fault density D' is computed for a given critical masking step as a product of a historical total defect density $D_t$ (i.e., an expected defect density $D_t$) associated with the masking step and a factor expressing the fraction of defects which are expected to result in catastrophic failures $f_c$. Calculated values of critical chip area A' and electrical fault density D' are then substituted for variables A and D, respectively, in a selected yield prediction model equation in order to compute an estimated yield value for each critical masking step.

BRIEF DESCRIPTION OF THE DRAWINGS

Other objects and advantages of the invention will become apparent upon reading the following detailed description and upon reference to the accompanying drawings in which:

FIG. 2 is a top plan view of a unit cell model for a first critical masking step of a wafer fabrication process;

Figure 1A:
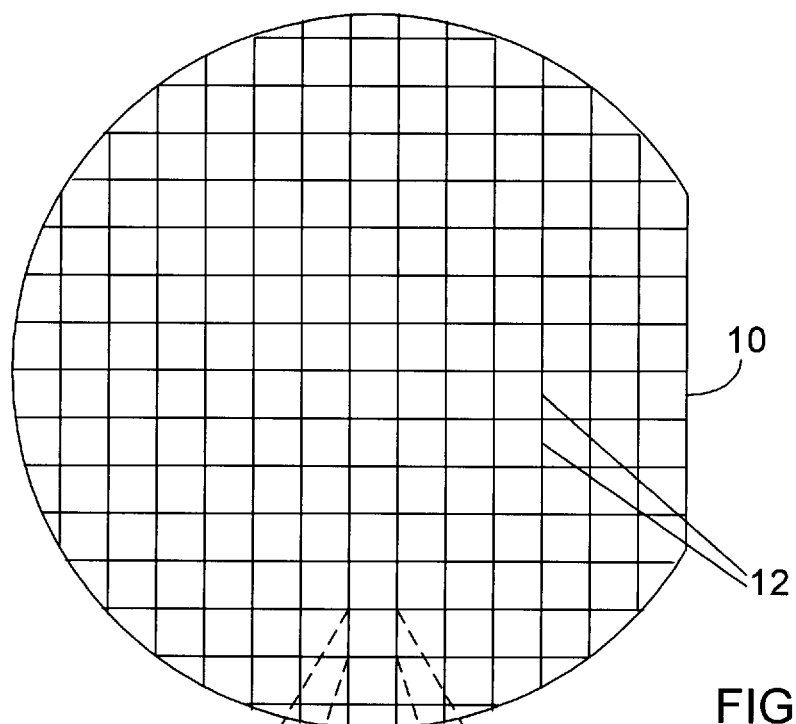
FIG. 1a illustrates a frontside surface of a silicon wafer upon which many identical chips are to be formed during a wafer fabrication process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Several researchers have developed yield prediction models in which estimated yield Y is a function of chip area A and catastrophic defect density D. Information in Table 1 below is taken from a similar table which appears in the W. R. Runyan et al. article referenced above.

TABLE 1

Yield Prediction Models.

| Yield Equation | Author |
| --- | --- |
| $Y = \left( \dfrac{1 - e^{-DA}}{DA} \right)^2$ | Murphy |
| $Y = e^{-\sqrt{DA}}$ | Seeds |
| $Y = \dfrac{1}{1 + DA}$ | Price (Bose-Einstein) |

Defects are invariably introduced during each step in a wafer fabrication process. A predicted yield Y' for the entire wafer fabrication process may be expressed as a mathematical product of estimated yields $Y_i$ for each of n steps in the process:

$$Y' = \prod_{i=1}^{n} Y_i$$

Defects are introduced into layers of desired materials during depositions of the layers. Such materials include silicon dioxide, silicon nitride, metal composites, polycrystalline silicon (polysilicon), and single-crystal silicon. Additional defects are introduced during subsequent patterning steps (i.e., masking and etching steps). Some fraction of the total number of defects introduced during depositions, masking steps, and etching steps are catastrophic. Several of the masking steps are preferably used to form features with minimum dimensions or spacings within the selected unit cell region. The fractions of catastrophic defects associated with such features are expectedly greater. The lower yields of such masking steps significantly impact the overall yield for product wafers manufactured using the wafer fabrication process. Accordingly, such masking steps may be deemed critical masking steps. A close estimation of the predicted yield Y' for the wafer fabrication process may be computed by including only the estimated yields for critical masking steps in the above equation for Y'.

During a masking step, a desired pattern is first transferred to a layer of a photo-sensitive material (i.e., photoresist) deposited on an upper surface of a silicon wafer. The photoresist layer is then exposed to light transmitted through a mask. The mask includes an opaque region through which light does not pass, and a clear (i.e., light transmissive) region. The exposed photoresist layer is then developed, during which portions of the photoresist layer are removed in areas where subsequent access to the upper surface of the silicon wafer is desired. A subsequent etching step may remove material from exposed areas of the upper surface of the silicon wafer not protected by remaining portions of the photoresist layer. Alternately, dopant atoms may be introduced into the silicon wafer in exposed areas of the upper surface of the silicon wafer not protected by remaining portions of the photoresist layer. Following either etching or doping, the remaining photoresist material is removed. During exposure, the mask is typically located just above the surface of the wafer. The presence of any particulate contaminants on the surface of the mask or on the surface of the photoresist layer which block or diffuse incident light cause imperfect pattern registrations (i.e., imperfect feature formations) and reduced yield.

It is noted that a given wafer fabrication process may be used to manufacture more than one type of integrated circuit. The silicon wafers upon which integrated circuits (i.e., products) are formed are also called product wafers. Each integrated circuit product typically has an arrangement of features which is different from all other products. Accordingly, the yields associated with each product are also independent, even if the products are manufactured using the same wafer fabrication process. Thus the present method produces a predicted yield value associated with a particular product, and not with the wafer fabrication process itself.

As mentioned above, many chips produced today have several regions containing large numbers of features with common physical dimensions. Catastrophic defect density D is reasonably different for each region. The catastrophic defect density of a particular region is, in general, inversely proportional to the physical dimensions of features formed in the region as described above. Formed features with physical dimensions which are small relative to the physical dimensions of other formed features are more vulnerable to defects introduced during a given masking step. Instead of simply using the physical dimensions of the chip in the calculations of the yield values associated with each critical masking step, the present method involves a determination of a critical chip area A' for each masking step. Each value of critical chip area A' is determined using a unit cell model associated with the masking step.

The electrical fault density D' associated with a given masking step is related to an expected total number of defects per unit of surface area $D_t$ by:

$$D' = D_t f_c$$

where $f_c$ is an estimate of the fraction of the defects which will result in catastrophic failures. As mentioned above, particulate contaminants (i.e., defects) are introduced during layer depositions and subsequent masking and etching steps. The expected total number of defects per unit of surface area (i.e., the total defect density) $D_t$ is derived from historical measurements typically conducted using commercially available laser scanning devices. Such laser scanning techniques are used to count the total number of particulate contaminants present upon an exposed surface of a wafer or within and upon a layer of a desired material deposited upon an exposed surface of a wafer.

Electronic devices are formed upon "product" wafers subjected to the steps of a wafer fabrication process. "Monitor" wafers processed independently of product wafers are used to measure total numbers of defects introduced onto wafers during selected steps of the wafer fabrication process. For example, a masking step which forms features upon an exposed surface of a wafer typically involves depositing a layer of a desired material upon the exposed surface, applying a layer of photosensitive photoresist over the layer of the desired material, exposing a portion of the photoresist layer to light passed through a mask, removing the exposed portion (positive photoresist) or the unexposed portion (negative photoresist) of the photoresist layer (i.e., developing the photoresist layer), etching a portion of the layer of the desired material not covered by a remaining portion of the photoresist layer, and removing the remaining portion of the photoresist layer. The total number of defects introduced during the masking step may be determined by summing the number of defects introduced during each step involved in the masking step.

For the deposition step, the total number of defects upon an exposed surface of a monitor wafer is measured before subjecting the monitor wafer to the deposition step. Following the deposition step, the total number of defects present within and upon the deposited layer is measured. The total number of defects introduced during the deposition step is the total number of defects present within and upon the deposited layer following the deposition step minus the total number of defects present upon the exposed surface of the monitor wafer prior to the deposition step.

For the photoresist application step, the total number of defects upon an exposed surface of a monitor wafer is measured before processing the monitor wafer through the photoresist application apparatus. As laser scanning measurements to determine the numbers of defects upon surfaces are most accurate when the surfaces are substantially planar, the monitor wafer is processed through the photoresist application apparatus, but the photoresist layer is not applied to the exposed surface of the monitor wafer. Following the processing of the monitor wafer through the photoresist apparatus, the total number of defects present upon the exposed surface of the monitor wafer is measured. The total number of defects introduced during the photoresist application step is the total number of defects present upon the exposed surface of the monitor wafer following the processing of the monitor wafer through the photoresist application apparatus minus the total number of defects present upon the exposed surface of the monitor wafer prior to processing.

For the exposure step, the total number of defects upon an exposed surface of a monitor wafer is measured before subjecting the monitor wafer to the exposure step. Following the exposure step, the total number of defects present upon the exposed surface of the monitor wafer is measured. The total number of defects introduced during the exposure step is the total number of defects present upon the exposed surface of the monitor wafer following the exposure step minus the total number of defects present upon the exposed surface of the monitor wafer prior to the exposure step.

For the developing step, the total number of defects upon an exposed surface of a monitor wafer is measured before subjecting the monitor wafer to the developing step. Following the developing step, the total number of defects present upon the exposed surface of the monitor wafer is measured. The total number of defects introduced during the developing step is the total number of defects present upon the exposed surface of the monitor wafer following the developing step minus the total number of defects present upon the exposed surface of the monitor wafer prior to the developing step.

For the etching step, a monitor wafer is prepared by depositing a layer of the desired material upon an exposed surface of the wafer. The total number of defects upon and within the layer of the desired material is measured before subjecting the monitor wafer to the etching step. During the etching step, the layer of the desired material is substantially removed. Following the etching step, the total number of defects present upon the exposed surface of the monitor wafer is measured. The total number of defects introduced during the etching step is the total number of defects present upon the exposed surface of the monitor wafer following the etching step minus the total number of defects upon and within the layer of the desired material prior to the etching step.

For the resist removal step, the total number of defects upon an exposed surface of a monitor wafer is measured before subjecting the monitor wafer to the resist removal step. Following the resist removal step, the total number of defects present upon the exposed surface of the monitor wafer is measured. The total number of defects introduced during the resist removal step is the total number of defects present upon the exposed surface of the monitor wafer following the resist removal step minus the total number of defects present upon the exposed surface of the monitor wafer prior to the resist removal step.

Once the total number of defects introduced during a given masking step is determined by summing the number of defects introduced during each step involved in the masking step, the value of $D_t$ associated with the masking step is calculated by dividing the total number of defects introduced during the masking step by the surface area of the wafer. The value of $f_c$ associated with a given masking step is derived from historical yield values for the masking step.

The present method is best described by example. FIGS. 1–10 will be used to describe the manufacture of multiple complementary metal oxide semiconductor (CMOS) integrated circuits upon the same silicon wafer using nine critical masking steps. The total surface area of each chip is 1.0 cm$^2$.

In this example, the Seeds yield prediction model will be used to calculate estimated yield values for all critical masking steps. Other suitable yield models include those listed in Table 1. It is noted that any yield prediction model may be used to calculate an estimated yield value for a given critical masking step.

For simplicity, the expected total number of defects per square centimeter $D_t$, determined from historical particulate contaminant measurements, is assumed to have a value of 0.02 defects/cm$^2$ for all critical masking steps. It is also assumed that an estimate of the fraction of the defects which will result in catastrophic failures $f_c$, derived from historical yield values associated with each critical masking step, is 0.02 for all critical masking steps. Thus the electrical fault density D' for all critical masking steps is:

$$D'=D_t\cdot f_c$$

$$D'=(0.02/cm^2)\cdot(0.02)=4.0\times10^{-4}/cm^2$$

Figure 1B:
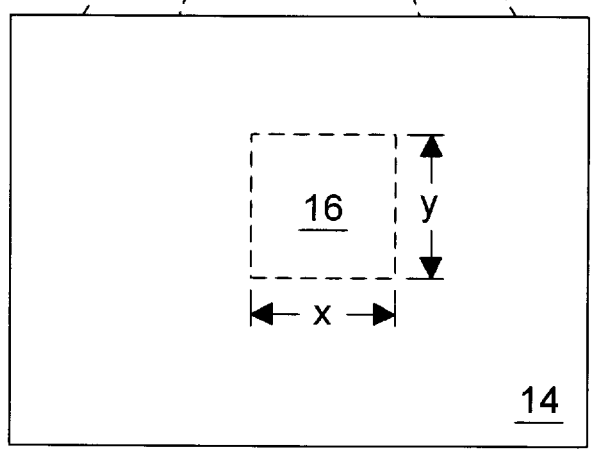
FIG. 1b is a detailed view of the portion of the frontside surface of the silicon wafer in FIG. 1a associated with a single chip.

A unit cell region within the boundaries of a single chip to be formed on the surface of a silicon wafer is first chosen to represent the formation of features upon the entire chip. FIG. 1a illustrates a frontside surface of a silicon wafer 10 upon which many identical chips 12 are to be formed during a wafer fabrication process. Chips 12 represent a particular product with a unique arrangement of features (i.e., layout), and silicon wafer 10 is referred to as a product wafer. FIG. 1b is a detailed view of the portion of the frontside surface of silicon wafer 10 associated with a single chip 14. A unit cell region 16 is chosen to represent the formation of features upon the entire surface of chip 14. As shown, unit cell region 16 is located within the boundaries of chip 14. Unit cell region 16 preferably contains several features formed with minimum dimensions and spacings, according to the design rules for the product, during several of the masking steps of the wafer fabrication process. When several masking steps form features with minimum dimensions and spacings within unit cell region 16, the resulting yield prediction for product wafers manufactured using the wafer fabrication process will advantageously be a conservative one.

Unit cell region 16 has dimensions x and y as shown in FIG. 1b. Unit cell models for all critical masking steps are the portions of the corresponding masks which form features within unit cell region 16. Thus all unit cell models have the same exterior dimensions x' and y', where x'=k·x and y'=k·y, where k is typically much greater than 1.

The use of positive photoresist is assumed in the present example, wherein opaque regions of a mask correspond to remaining portions of a patterned layer. The alternative use of negative photoresist would result in clear regions of a mask corresponding to remaining portions of a patterned layer.

A set of design rules is used to prepare the masks used during the masking steps of the manufacturing process. The design rules specify minimum physical dimensions of features and minimum spacings between features for each masking step, and represent the extreme limits of the capability of the photolithographic process to produce features upon the surface of the silicon wafer. Determinations of critical regions, both opaque and clear, for unit cell models are based upon the design rules for the corresponding masking step of the process. The following criteria are used to determine critical regions of unit cell models for critical masking steps:

Critical Masking Steps which Precede Etch Steps:
1) an opaque region of a unit cell model which corresponds to a feature formed on the surface of the wafer having a minimum physical dimension is considered a critical opaque region;
2) a clear region of a unit cell model which corresponds to a minimum spacing distance between features is considered a critical clear region;
3) all opaque regions associated with masking structures formed over active regions on the surface of the silicon wafer prior to local oxidation of silicon (LOCOS) steps are considered critical opaque regions;
4) all opaque regions associated with the formations of contact structures (i.e., landing pads) present within a unit cell model are considered critical opaque regions;
5) all clear regions of a unit cell model associated with the formations of contact holes and vias are considered critical clear regions;

Critical Masking Steps which Precede Doping Steps:
6) all clear regions of a unit cell model associated with a subsequent doping step are considered critical clear regions; and All Critical Masking Steps:
7) if at least 75 percent of the area of a unit cell model is determined to be critical, than the entire area of the unit cell model is considered critical.

In the present example, memory cells are to be formed within each chip. A unit cell region is chosen which is a portion of a single memory cell structure. A majority of the process masking steps form features within critical regions of the unit cell region. The selection of such a unit cell region is advantageously expected to produce a conservative yield prediction.

During manufacture of a typical CMOS integrated circuit, one or more masking steps are used to form doped well regions within a silicon wafer. In a single-well CMOS process, n-type wells are formed in a p-type silicon wafer, and p-type wells are formed in an n-type silicon wafer. In the present example, the one or more masking steps associated with such well formations are not considered critical. In addition, a final masking step used to gain access to bonding pads through a passivation layer is also not considered a critical masking step.

Metal oxide semiconductor (MOS) transistors (i.e., devices) are typically formed in active regions separated by field regions. Local oxidation of silicon (LOCOS) is a common technique used to form a thick, insulating layer of silicon dioxide (oxide) over the field regions. In a typical LOCOS process, a thin pad oxide layer is formed over the frontside surface of the silicon wafer. A silicon nitride (nitride) layer is then deposited over the pad oxide layer, forming a combined nitride/oxide Layer. A masking step is then used to remove the portions of the nitride/oxide layer over the field regions. During a subsequent oxidation step, a thick oxide layer is selectively grown over the exposed field regions. The remaining portions of the nitride/oxide layer, located over the active regions, prevent oxidation of the underlying silicon during the oxidation step.

The first masking step, used to pattern the nitride/oxide layer, is also the first critical masking step. FIG. 2 is a top plan view of a unit cell model 18 associated with the first critical masking step. Opaque region 20 of unit cell model 18 represents a masking structure formed over a single active region on the surface of the silicon wafer prior to local oxidation of silicon (LOCOS) steps, and is thus considered a critical opaque regions in accordance with the above criteria. The remaining portion of unit cell model 18 is clear. Unit cell model 18 has outside dimensions of x' and y' as shown. Opaque region 20 has dimensions a1 and b1 as shown, and an area of (a1·b1).

One method of calculating critical area A' associated with the first critical masking step involves: (i) identifying one or more critical regions of unit cell model 18, (ii) determining the fraction of unit cell model 18 which is taken up by the one or more critical regions, and (iii) multiplying the fraction by chip area A. The only critical region of unit cell model 18 is opaque region 20 with an area of (a1·b1). The fraction of unit cell model 18 taken up by critical opaque region 20 is (a1·b1)/(x'·y'). Alternately, critical area A' may be determined by scaling unit cell model 18 to the dimensions of the unit cell region, determining the area of opaque region 20 directly, and multiplying the area of opaque region 20 by the number of unit cell regions n which will fit within the boundaries of a single chip:

$$n = \frac{A}{(x \cdot y)}$$

where A is the area of a single chip.

A third method of calculating critical area A' is to determine the dimension a1' corresponding to a1 and b1' corresponding to b1 within the unit cell region on the surface of the silicon wafer, then multiplying the product of a1' and b1' by the number of unit cell regions n which will fit within the boundaries of a single chip.

A preferred method estimates critical chip area A' using information about the mask used during the first critical masking step. Computer programs used to design masks are typically able to provide the fractions of a mask which are clear and opaque. Critical chip area A' is preferably estimated from such data as:

$$A' = A \cdot f_{OPAQUE}$$

where A is the total surface area of each chip and $f_{OPAQUE}$ is the fraction of the mask used during the first masking step which is opaque. Assuming the mask used in the first critical masking step is 18.8 percent opaque, then $f_{OPAQUE}$ has a value of 0.188, and:

$$A'=(1.0 \text{ cm}^2) \cdot (0.188)=0.188 \text{ cm}^2$$

The Seeds yield prediction model, the value for the critical area A' associated with the first masking step, and the value for the electrical fault density D' determined above are then used to determine the yield for the first critical masking step $Y_1$. $Y_1$ is computed as:

$$Y_1 = e^{-\sqrt{D'A'}}$$

Using the value for critical area A' determined using the preferred estimation method, $$Y_1 = \exp\{-[(4.0 \times 10^{-4}) \cdot (0.188)]^{0.5}\}$$

$Y_1 = 0.991366$

Following formation of the thick oxide layer over the field regions, the remaining portions of the nitride/oxide layer are removed from over the active regions. MOS transistors are subsequently formed within the active regions. A thin gate oxide layer is first formed over the active regions, and a layer of doped polysilicon is formed over the gate oxide layer. A second critical masking step is used to pattern the doped polysilicon layer. The remaining portions of the doped polysilicon layer form gate electrodes of the MOS transistors and a first layer of conductive traces (i.e., interconnects). Such interconnects electrically connect the MOS transistors to input and output terminals, power supply and ground terminals, and to one another.

Figure 3:
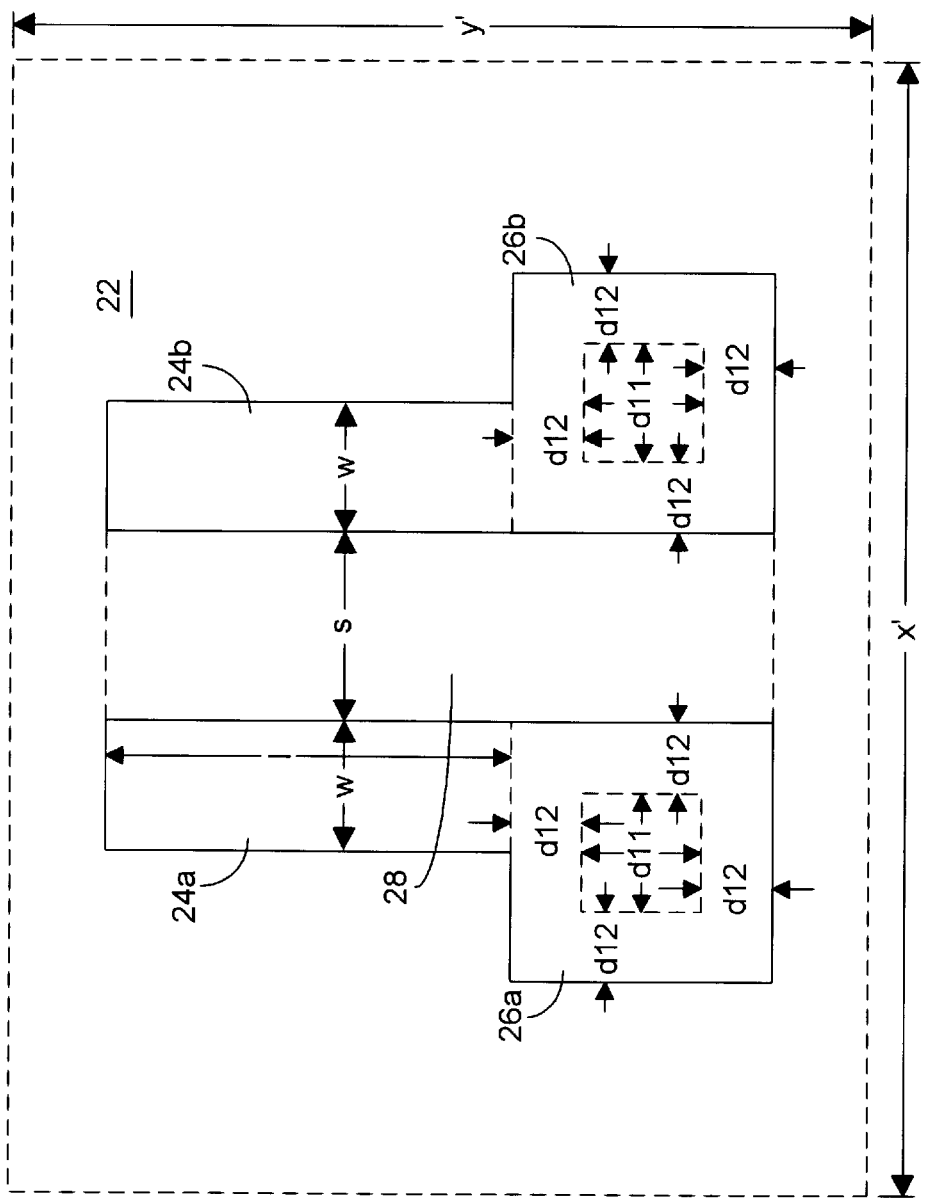
FIG. 3 is a top plan view of a unit cell model for a second critical masking step of the wafer fabrication process.

FIG. 3 is a top plan view of a unit cell model 22 associated with the second critical masking step. As with all unit cell models, unit cell model 22 has outside dimensions of x' and y' as shown. Unit cell model 22 includes opaque line regions 24a and 24b and opaque contact regions 26a and 26b. Opaque line regions 24a and 24b have the same dimensions, as do opaque contact regions 26a and 26b. The remaining portion of unit cell model 22 is a clear region.

One method of calculating critical area A' associated with the second critical masking step involves: (i) identifying one or more critical regions of unit cell model 22, (ii) determining the fraction of unit cell model 22 which is taken up by the one or more critical regions, and (iii) multiplying the fraction by chip area A. As formed on the surface of the silicon wafer (i.e., as printed), widths w of opaque line regions 24a and 24b are equal to the minimum polysilicon width for the second critical masking step as specified by the design rules for the process. Thus opaque line widths 24a and 24b are considered critical opaque regions in accordance with the above criteria. Opaque contact regions 26a and 26b are also considered critical opaque regions in accordance with the above criteria. Thus all opaque regions of unit cell model 22 are critical opaque regions. In addition, dimension s of a clear region 28 which separates the two opaque regions of unit cell model 22 is equal to the minimum polysilicon spacing for the second critical masking step as specified by the design rules for the process. Thus clear region 28 is a critical clear region. The fraction of unit cell model 22 which is taken up by critical regions is thus the sum of the areas of the opaque regions and clear region 28, divided by the total area of unit cell model 22, (x'·y').

Critical chip area A' may also be calculated by scaling unit cell model 22 to the dimensions of the unit cell region, summing the areas of the two opaque regions and clear region 28, and multiplying the sum by the number of unit cell regions n which will fit within the boundaries of a single chip. Thus:

$$A'=(A_{CL,UC}+A_{CS,UC}) \cdot n$$

$$n = \frac{A}{(x \cdot y)}$$

where:

$A_{CL,UC}$=area of critical (opaque) line in the unit cell region, $A_{CS,UC}$=area of critical (clear) space in the unit cell region, and A=area of each chip A preferred method uses information concerning the fractions of the mask which are clear and opaque. As mentioned above, mask design programs are typically able to provide this information. The area of critical (opaque) line per unit cell region $A_{CL,UC}$ is first estimated as:

$$A_{CL,UC}=A_{UC} \cdot f_{OPAQUE}$$

where $A_{UC}$ is the area of the unit cell region and $f_{OPAQUE}$ is the fraction of the mask used during the second masking step which is opaque. For example, if x=8.0 microns ($\mu$m) and y=6.0 $\mu$m, then the area of the unit cell region is 48.0 square microns ($\mu$m$^2$). If the mask used in the second critical masking step is 10.9 percent opaque, then $f_{OPAQUE}$ has a value of 0.109, and:

$$A_{CL,UC}=(48.0 \ \mu\text{m}^2) \cdot (0.109)=5.232 \ \mu\text{M}^2$$

The area of critical (clear) space per unit cell region $A_{CS,UC}$ is then determined using the estimated value of $A_{CL,UC}$. $A_{CS,UC}$ is equal to $(((d_{11}+2 \cdot d_{12})+) \cdot s)$, where contact dimension $d_{11}$, contact overlap $d_{12}$, and line spacing s are as formed (i.e., as printed) dimensions on the surface of the silicon wafer. The dimensions of $d_{11}$, $d_{12}$, and s are the minimum dimensions specified by the design rules. The following equation for $A_{CL,UC}$ is solved for length l:

$$A_{CL,UC}=5.232 \ \mu\text{m}^2=2 \cdot [(l \cdot w)+(d_{11}+2 \cdot d_{12})l\ 2]$$

Line width w is also as printed on the surface of the silicon wafer. If $d_{11}$=w=0.5 micron ($\mu$m), $d_{12}$=0.25 $\mu$m, and s=1.0 $\mu$m, then length l=3.232 $\mu$m, and:

$$A_{CS,UC}=(((1.0 \ \mu\text{m})+3.232 \ \mu\text{m}) \cdot 1.0 \ \mu\text{m})=4.232 \ \mu\text{m}^2$$

Critical area A' is thus:

$$A'=(5.232 \ \mu\text{m}^2+4.232 \ \mu\text{m}^2) \cdot n$$

$$n=A/A_{UC}=(1.0 \text{ cm}^2/\text{chip})/(48.0 \ \mu\text{m}^2/\text{unit cell region})$$

$$n=2.0833 \times 10^6 \text{ unit cell regions/chip } A'=0.197 \text{ cm}^2$$

Using the Seeds yield prediction model and the value for the electrical fault density D' determined above, the yield value for the second critical masking step $Y_2$ is computed as:

$$Y_2 = e^{-\sqrt{D'A'}}$$

$$Y_2 = \exp\{-[(4.0 \times 10^{-4}/\text{cm}^2) \cdot (0.197 \text{ cm}^2)]^{0.5}\}$$

$$Y_2 = 0.991162$$

Two subsequent masking steps are used to form source and drain regions of n-channel and p-channel MOS devices.

In this example, a first masking step is used to form openings in a first photoresist layer through which n-type dopant atoms will be introduced into the silicon wafer. Following the formations of the source and drain regions of the n-channel devices, the remaining portion of the first photoresist layer is removed. A second photoresist layer is then formed on the surface of the silicon wafer, and a second masking step is used to form openings in the second photoresist layer through which p-type dopant atoms will be introduced into the silicon wafer. The introduction of p-type dopant atoms forms the source and drain regions of the p-channel devices.

Figure 4:
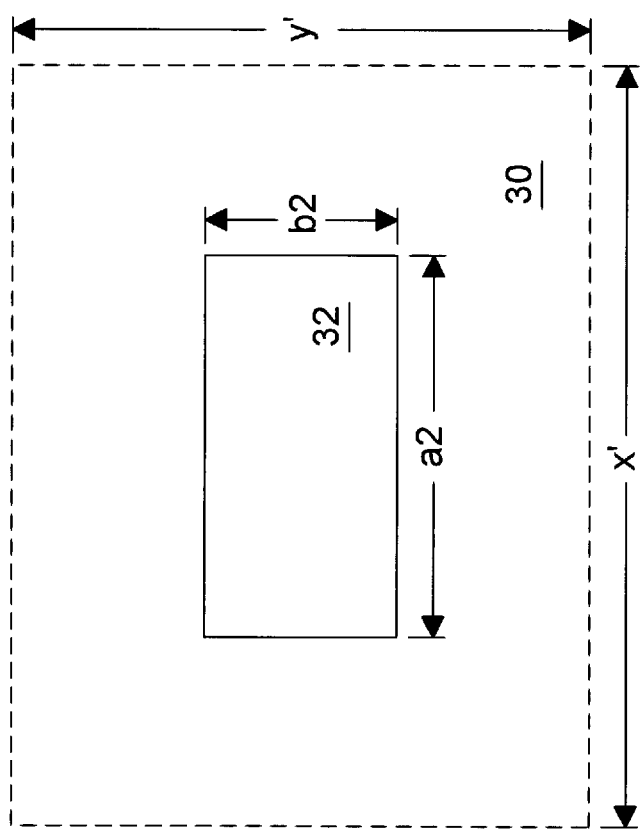
FIG. 4 is a top plan view of a unit cell model for a third critical masking step of the wafer fabrication process.

In this example, the unit cell region contains a single n-channel device. FIG. 4 is a top plan view of a unit cell model 30 associated with a third critical masking step used to form source and drain regions of the n-channel device. Clear region 32 of unit cell model 30 has dimensions a2 and b2 as shown in FIG. 4, and represents an opening formed in the photoresist layer through which dopant atoms will be introduced into the silicon wafer. Clear region 32 is thus a critical clear region in accordance with the above criteria. The remainder of unit cell model 30 is opaque.

A first method of calculating critical area A' involves: (i) identifying one or more critical regions of unit cell model 30, (ii) determining the fraction of unit cell model 30 which is taken up by the one or more critical regions, and (iii) multiplying the fraction by chip area A. An alternate method of calculating critical area A' involves determining the dimensions a2 and b2 as printed on the surface of the wafer, then multiplying the product of a2 and b2 by the number of unit cell regions n which will fit within the boundaries of a single chip. As before, a preferred method estimates critical chip area A' using information about the mask provided by the computer program used to design the mask. Mask design programs are typically able to provide the fractions of a mask which are clear and opaque. Critical chip area A' is preferably estimated from such data as:

$$A' = A \cdot f_{CLEAR}$$

where A is the total surface area of each chip and $f_{CLEAR}$ is the fraction of the mask which is clear.

Assuming the mask used in the third critical masking step is 12.5 percent clear, then $f_{CLEAR}$ has a value of 0.125, and:

$$A' = (1.0 \text{ cm}^2) \cdot (0.125) = 0.125 \text{ cm}^2$$

Using the Seeds yield prediction model and the value for the electrical fault density D' determined above, the yield for the third critical masking step $Y_3$ is computed as:

$$Y_3 = e^{-\sqrt{D'A'}}$$

$$Y_3 = \exp\{-[(4.0 \times 10^{-4}) \cdot (0.125)]^{0.5}\}$$

$$Y_3 = 0.992954$$

It is noted that had the selected unit cell region contained at least one p-channel device, the masking step used to form the source and drain regions of p-channel devices would also be deemed critical. The yield of such a masking step would be calculated in a manner similar to the third critical masking step.

After device source and drain regions have been formed, an insulating dielectric layer is formed over the surface of the silicon wafer. A fourth critical masking step is associated with the forming of contact holes through the dielectric layer. Electrical contacts will later be formed in the contact holes, connecting conductive traces of one or more subsequently formed metal interconnect layers to the polysilicon gate electrodes, polysilicon interconnect lines, and to the source and drain regions of the MOS devices.

Figure 5:
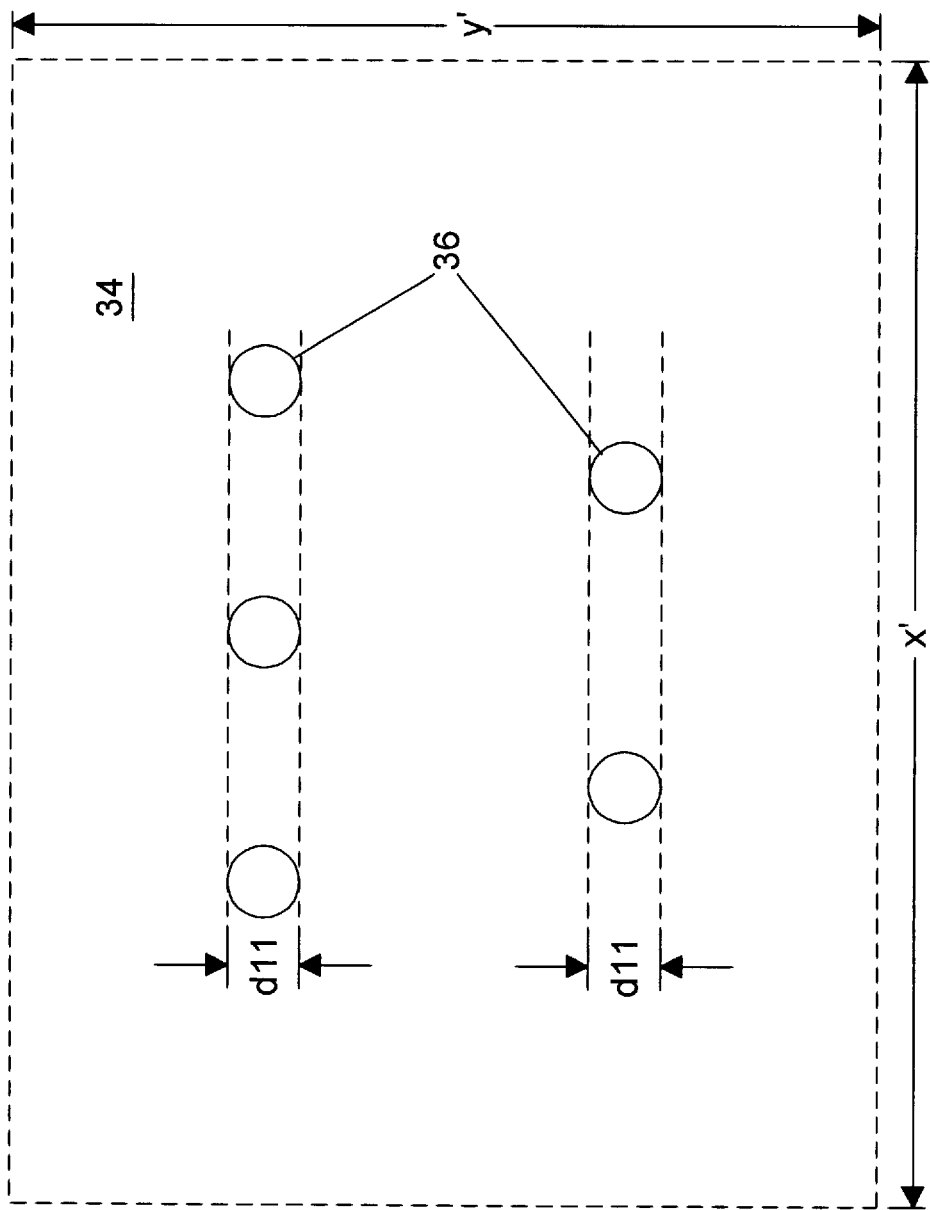
FIG. 5 is a top plan view of a unit cell model for a fourth critical masking step of the wafer fabrication process.

FIG. 5 is a top plan view of a unit cell model 34 associated with the fourth critical masking step. Unit cell model 34 has outside dimensions of x' and y' as shown. Unit cell model 34 includes five circular clear regions 36 representing contact holes. The five circular clear regions 36 are considered critical clear regions in accordance with the above criteria. The remaining portion of unit cell model 34 is opaque. Clear regions 36 have as printed diameters, corresponding to $d_{11}$, of 0.5 $\mu$m. The critical chip area A' for the fourth critical masking step is expressed as:

$$A' = A_C \cdot n$$

where $A_C$ is the total area of the clear regions per unit cell region and n is the number of unit cell regions per chip. Thus:

$$A_c = [\pi \cdot (0.25 \ \mu m)^2] \text{per contact hole} \cdot 5 \text{ contact holes/unit cell region}$$

$$A_c = 0.9817 \ \mu m^2/\text{unit cell region}$$

and $$n = 2.0833 \times 10^6 \text{ unit cell regions/chip}$$

thus $$A' = (0.9817 \ \mu m^2/\text{unit cell region}) \cdot (2.0833 \times 10^6 \text{ unit cell regions/chip})$$

$$A' = 0.0205 \text{ cm}^2/\text{chip}$$

Using the Seeds yield prediction model and the value for the electrical fault density D' determined above, the yield for the fourth critical masking step $Y_4$ is computed as:

$$Y_4 = e^{-\sqrt{D'A'}}$$

$$Y_4 = \exp\{-[(4.0 \times 10^{-4}) \cdot (0.0205)]^{0.5}\}$$

$$Y_4 = 0.997141$$

After contact holes have been formed in the dielectric layer, a first layer of a metal (e.g., aluminum) is formed over the dielectric layer. A fifth critical masking step is used to pattern the first metal layer to form a first layer of metal interconnects.

Figure 6:
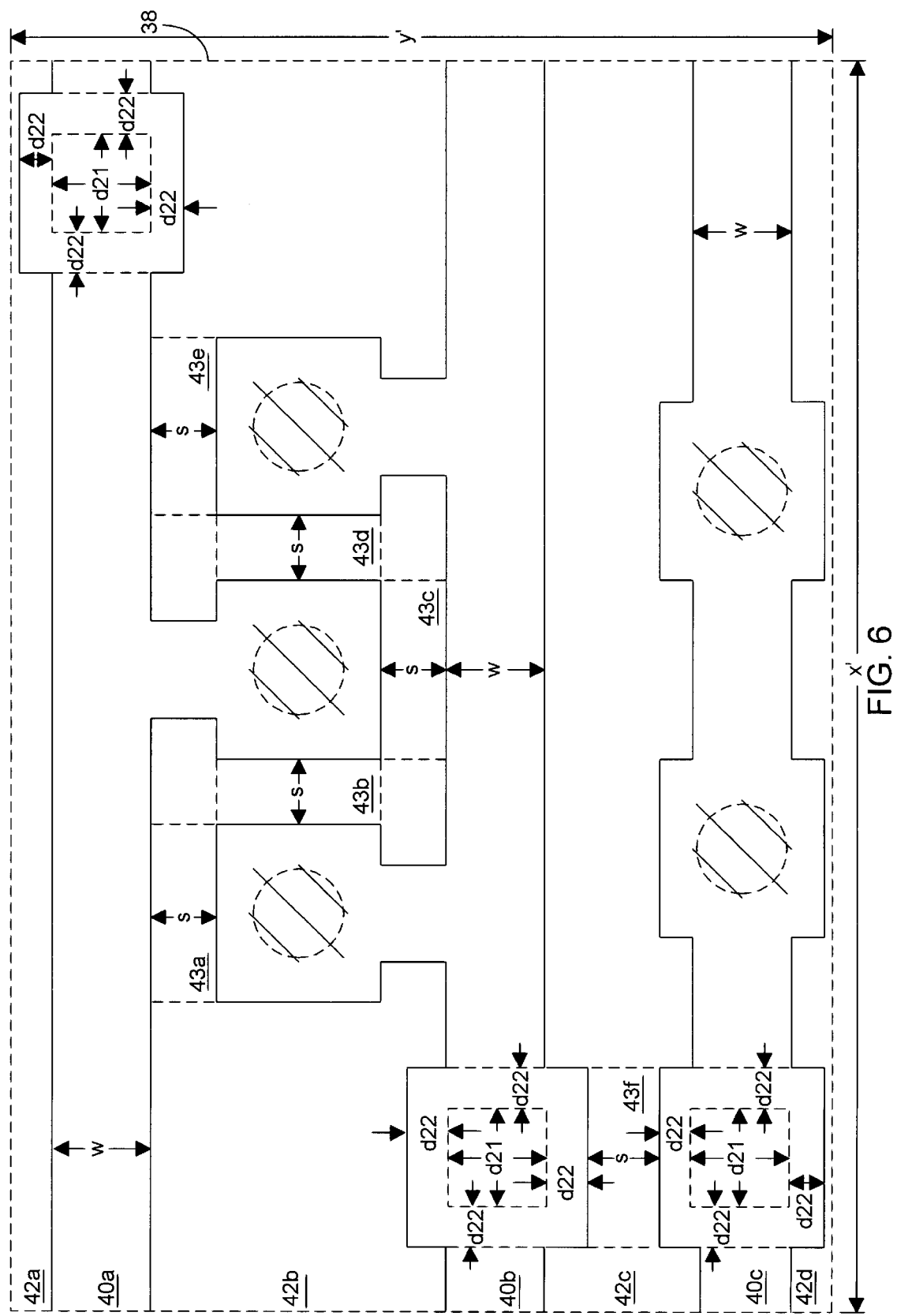
FIG. 6 is a top plan view of a unit cell model for a fifth critical masking step of the wafer fabrication process.

FIG. 6 is a top plan view of a unit cell model 38 associated with the fifth critical masking step. Unit cell model 38 includes opaque interconnect regions 40a–c and clear regions 42a–d. Critical chip area A' for the fifth masking step is calculated by: (i) identifying one or more critical regions of unit cell model 38, (ii) determining the fraction of unit cell model 38 which is taken up by the one or more critical regions, and (iii) multiplying the fraction by chip area A. The as printed widths w of opaque interconnect regions 40a–c are equal to the minimum metal width for the fifth critical masking step as specified by the design rules for the process, and all of the opaque contact regions included in interconnect regions 40a–c are considered critical opaque regions in accordance with the above criteria. Thus opaque interconnect regions 40a–c of unit cell model 38 are considered critical opaque regions. In addition, dimension s of clear regions 43a–f which separate opaque regions of unit cell model 38 is equal to the minimum metal spacing for the fifth critical masking step as specified by the design rules for the process. Thus clear regions 43a–f are critical clear regions.

The fraction of unit cell model 38 which is taken up by the critical regions, determined by summing the areas of opaque interconnect regions 40a–c and clear regions 43a–f of unit cell model 38 and dividing by the area of unit cell model 38, (x'·y'), is 44.3%. Thus critical chip area A' for the fifth masking step is:

$$A' = (1.0\ cm^2) \cdot (0.443) = 0.443\ cm^2$$

Alternately, critical chip area A' may have been determined by scaling unit cell model 38 to the dimensions of the unit cell region, summing the areas of the critical opaque and clear regions, and multiplying the sum by the number of unit cell regions n which will fit within the boundaries of a single chip.

Using the Seeds yield prediction model and the value for the electrical fault density D' determined above, the yield value for the fifth critical masking step $Y_6$ is computed as:

$$Y_5 = e^{-\sqrt{D'A'}}$$

$$Y_5 = \exp\{-[(4.0 \times 10^{-4}/cm^2) \cdot (0.443\ cm^2)]^{0.5}\}$$

$$Y_5 = 0.986777$$

Figure 7:
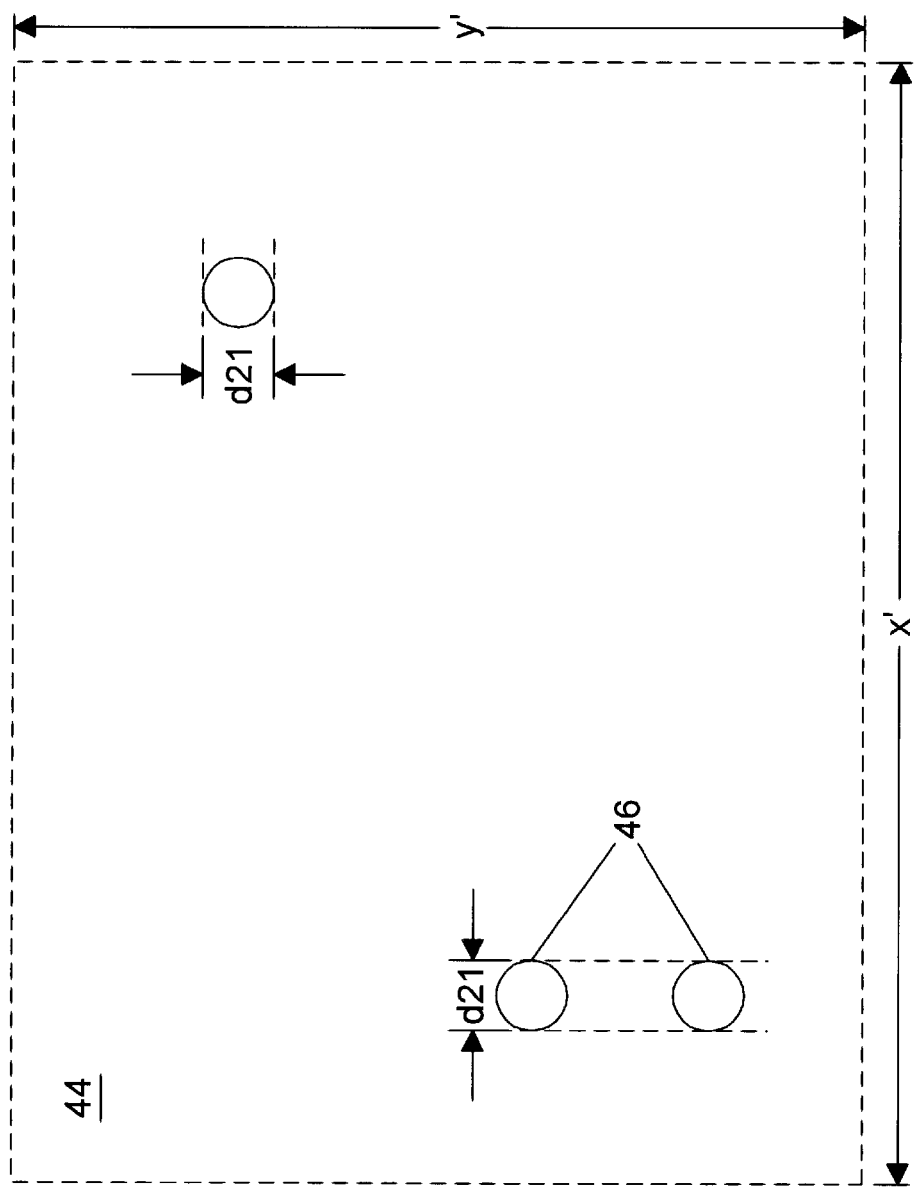
FIG. 7 is a top plan view of a unit cell model for a sixth critical masking step of the wafer fabrication process.

A first interlevel dielectric layer is then formed over the first layer of metal interconnects. A sixth critical masking step is associated with the forming of vias (i.e., holes for electrical contacts) through the first interlevel dielectric layer. FIG. 7 is a top plan view of a unit cell model 44 associated with the sixth critical masking step. Unit cell model 44 includes three circular clear regions 46 representing vias. Thus the three circular clear regions 46 are critical clear regions in accordance with the above criteria. The remaining portion of unit cell model 44 is an opaque region. Clear regions 46 have diameters $d_{21}$. The critical chip area A' for the sixth masking step is:

$$A' = A_C \cdot n$$

where $A_C$ is the clear area per unit cell region and n is the number of unit cell regions per chip. If the as printed diameters of the vias, corresponding to $d_{21}$, are 0.5 μm, then:

$$A_C = [\pi \cdot (0.25\ \mu m)^2] \text{per via} \cdot 3\ \text{vias/unit cell region}$$

$$A_C = 0.589\ \mu m^2/\text{unit cell region}$$

and $$n = 2.0833 \times 10^6\ \text{unit cell regions/chip}$$

thus $$A' = (0.589\ \mu m^2/\text{unit cell region}) \cdot (2.0833 \times 10^6\ \text{unit cell regions/chip})$$

$$A' = 0.01227\ cm^2/\text{chip}$$

Using the Seeds yield prediction model and the value for the electrical fault density D' determined above, the yield for the sixth critical masking step $Y_6$ is computed as:

$$Y_6 = e^{-\sqrt{D'A'}}$$

$$Y_6 = \exp\{-[(4.0 \times 10^{-4}) \cdot (0.01227)]^{0.5}\}$$

$$Y_6 = 0.997787$$

Figure 8:
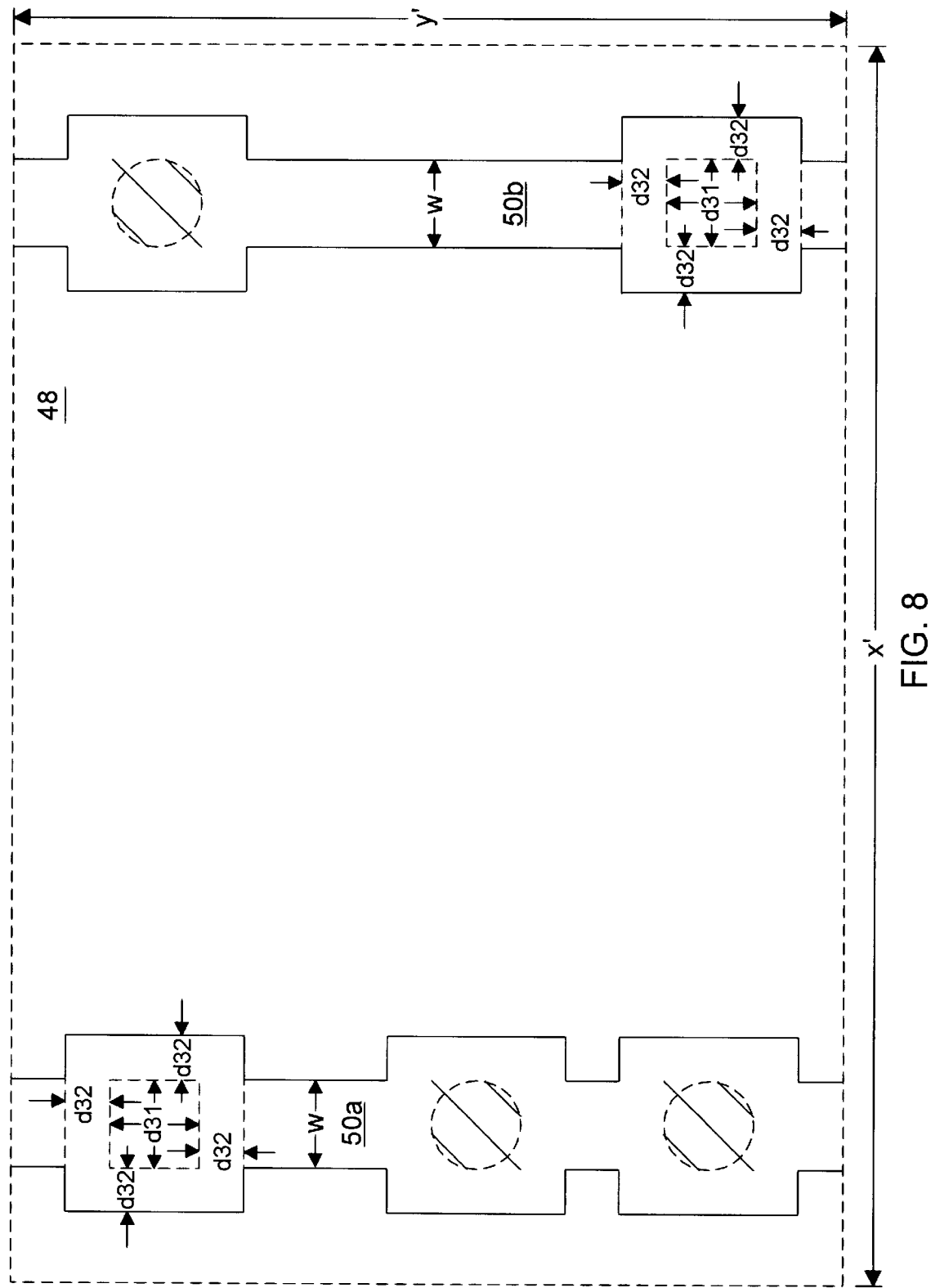
FIG. 8 is a top plan view of a unit cell model for a seventh critical masking step of the wafer fabrication process.

After vias have been formed in the first interlevel dielectric layer, a second layer of a metal is formed over the first interlevel dielectric layer. A seventh critical masking step is used to pattern the second metal layer to form a second layer of metal interconnects. FIG. 8 is a top plan view of a unit cell model 48 associated with the seventh critical masking step. Unit cell model 48 includes opaque interconnect regions 50a–b. The remaining portion of unit cell model 48 is a clear region.

Critical chip area A' for the seventh masking step may be calculated by: (i) identifying one or more critical regions of unit cell model 48, (ii) determining the fraction of unit cell model 48 which is taken up by the one or more critical regions, and (iii) multiplying the fraction by chip area A. The as printed widths w of opaque interconnect regions 50a–b are equal to the minimum metal width for the seventh critical masking step as specified by the design rules for the process, and all of the opaque contact regions included in interconnect regions 50a–b are considered critical opaque regions in accordance with the above criteria. Thus opaque interconnect regions 50a–b of unit cell model 48 are considered critical opaque regions. Unit cell model 48 contains no critical clear regions. Alternately, Critical chip area A' may be calculated by scaling unit cell model 48 to the dimensions of the unit cell region, summing the areas of the critical opaque regions and the critical clear regions, and multiplying the sum by the number of unit cell regions n which will fit within the boundaries of a single chip. In this case, however, only opaque interconnect regions 50a–b are considered critical regions. Critical chip area A' is preferably estimated using information about the mask as described above:

$$A' = A \cdot f_{OPAQUE}$$

where A is the total surface area of each chip and $f_{OPAQUE}$ is the fraction of the mask used during the seventh masking step which is opaque. Assuming the mask used in the seventh critical masking step is 17.7 percent opaque, then $f_{OPAQUE}$ has a value of 0.177, and:

$$A' = (1.0\ cm^2) \cdot (0.177) = 0.177\ cm^2$$

Using the Seeds yield prediction model and the value for the electrical fault density D' determined above, the yield value for the seventh critical masking step $Y_7$ is computed as:

$$Y_7 = e^{-\sqrt{D'A'}}$$

$$Y_7 = \exp\{-[(4.0 \times 10^{-4}/cm^2) \cdot (0.177\ cm^2)]^{0.5}\}$$

$$Y_7 = 0.991621$$

Figure 9:
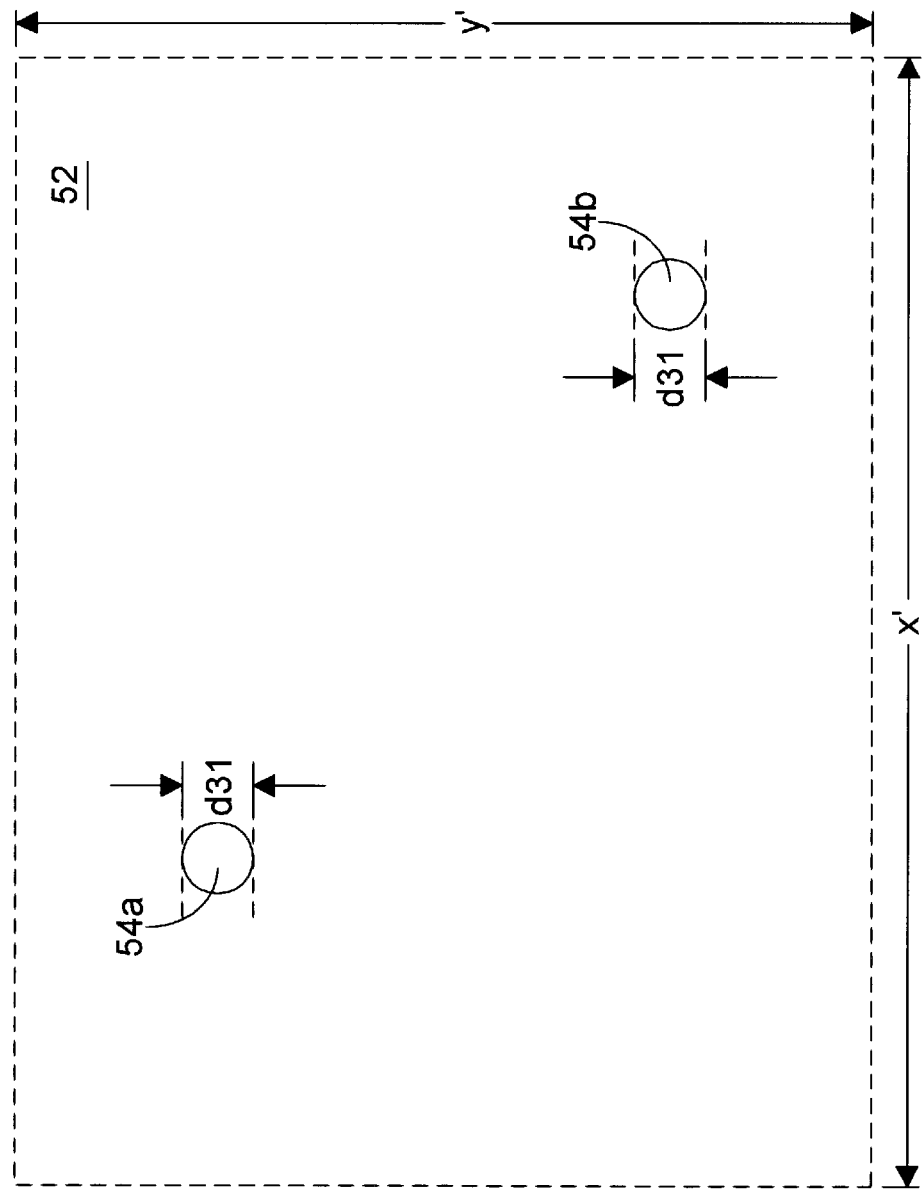
FIG. 9 is a top plan view of a unit cell model for an eighth critical masking step of the wafer fabrication process.

A second interlevel dielectric layer is then formed over the second layer of metal interconnects, and an eighth critical masking step is associated with the forming of vias through the second interlevel dielectric layer. FIG. 9 is a top plan view of a unit cell model 52 associated with the eighth critical masking step. Unit cell model 52 includes two circular clear regions 54a–b representing vias. Thus the two circular clear regions 54a–b are considered critical clear regions in accordance with the above criteria. The remaining portion of unit cell model 52 is an opaque region. Clear regions 54a–b have diameters $d_{31}$. The critical chip area A' for the eighth critical masking step is:

$$A' = A_C \cdot n$$

where $A_C$ is the clear area per unit cell region and n is the number of unit cell regions per chip. If the as printed diameters of the vias, corresponding to $d_{31}$, are 0.5 μm, then:

$A_C = [\pi \cdot (0.25 \, \mu m)^2]$ per via $\cdot$ 2 vias/unit cell region $A_C = 0.3927 \, \mu m^2$/unit cell region and $n = 2.0833 \times 10^6$ unit cell regions/chip thus $A' = (0.3927 \, \mu m^2/\text{unit cell region}) \cdot (2.0833 \times 10^6 \text{ unit cell regions/chip})$ $A' = 0.008181 \text{ cm}^2/\text{chip}$ Using the Seeds yield prediction model and the value for the electrical fault density D' determined above, the yield for the eighth critical masking step $Y_8$ is computed as:

$$Y_8 = e^{-\sqrt{D'A'}}$$

$$Y_8 = \exp\{-[(4.0 \times 10^{-4}) \cdot (0.008181)]^{0.5}\}$$

$$Y_8 = 0.998193$$

Figure 10:
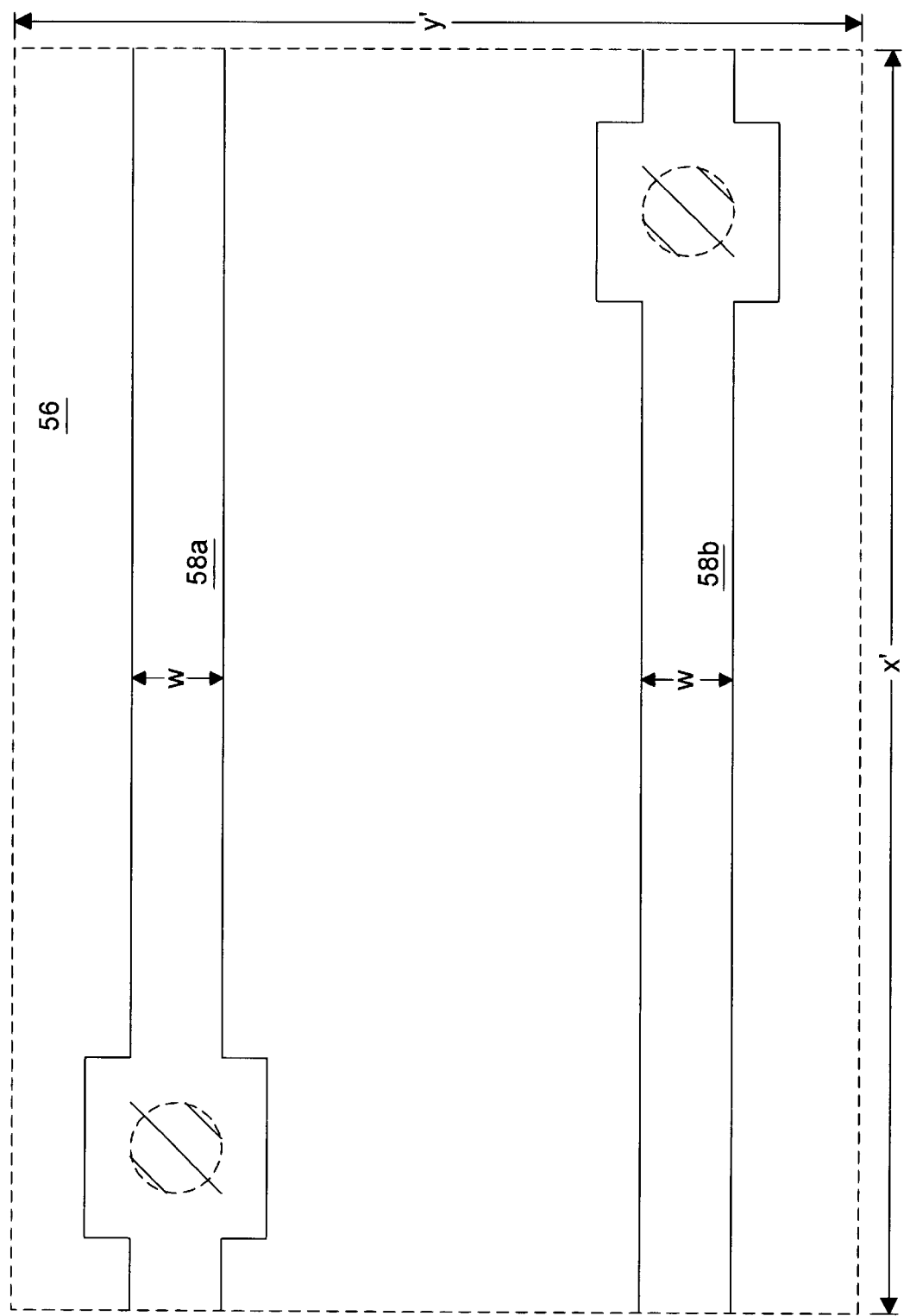
FIG. 10 is a top plan view of a unit cell model for a ninth critical masking step of the wafer fabrication process.

After vias have been formed in the second interlevel dielectric layer, a third and final layer of a metal is formed over the second interlevel dielectric layer. A ninth critical masking step is used to pattern the third metal layer to form a third layer of metal interconnects. FIG. 10 is a top plan view of a unit cell model 56 associated with the ninth critical masking step. Unit cell model 56 includes opaque interconnect regions 58a–b. The remaining portion of unit cell model 56 is a clear region.

Critical chip area A' for the ninth masking step may be calculated by: (i) identifying one or more critical regions of unit cell model 56, (ii) determining the fraction of unit cell model 56 which is taken up by the one or more critical regions, and (iii) multiplying the fraction by chip area A. The as printed widths w of opaque interconnect regions 58a–b are equal to the minimum metal width for the ninth critical masking step as specified by the design rules for the process, and all of the opaque contact regions included in interconnect regions 58a–b are considered critical opaque regions in accordance with the above criteria. Thus opaque interconnect regions 58a–b of unit cell model 56 are considered critical opaque regions. Unit cell model 56 contains no critical clear regions. Alternately, critical chip area A' may be determined by scaling unit cell model 56 to the dimensions of the unit cell region, summing the areas of the critical opaque regions and the critical clear regions, and multiplying the sum by the number of unit cell regions n which will fit within the boundaries of a single chip. In this case, however, only opaque interconnect regions 58a–b are considered critical regions. Critical chip area A' is preferably estimated using information about the mask as described above:

$$A' = A \cdot f_{OPAQUE}$$

where A is the total surface area of each chip and $f_{OPAQUE}$ is the fraction of the mask used during the ninth masking step which is opaque. Assuming the mask used in the ninth critical masking step is 18.8 percent opaque, then $f_{OPAQUE}$ has a value of 0.188, and:

$A' = (1.0 \text{ cm}^2) \cdot (0.188) = 0.188 \text{ cm}^2$

Using the Seeds yield prediction model and the value for the electrical fault density D' determined above, the yield value for the ninth critical masking step $Y_9$ is computed as:

$$Y_9 = e^{-\sqrt{D'A'}}$$

$$Y_9 = \exp\{-[(4.0 \times 10^{-4}/\text{cm}^2) \cdot (0.188 \text{ cm}^2)]^{0.5}\}$$

$$Y_9 = 0.991366$$

Table 2 below summarizes the estimated yield values for all nine critical masking steps.

TABLE 2

Yield Values For Critical Masking Steps.

| Critical Masking Step | Estimated Yield |
| --- | --- |
| 1 | 0.991366 |
| 2 | 0.991162 |
| 3 | 0.992954 |
| 4 | 0.997141 |
| 5 | 0.986777 |
| 6 | 0.997787 |
| 7 | 0.991621 |
| 8 | 0.998193 |
| 9 | 0.991366 |

As mentioned above, a predicted yield Y' for the entire wafer fabrication process is express as a product of estimated yields $Y_i$ for each of the nine critical masking steps in the process. Thus:

$$Y' = \prod_{i=1}^{9} Y_i$$

$$Y' = 0.940$$

It is noted that the present process is not limited to three layers of metal interconnects. Yields associated with the formations of vias in additional interlevel dielectric layers and the patterning of additional metal interconnect layers may be calculated as in the eighth and ninth masking steps above.

Figure 11:
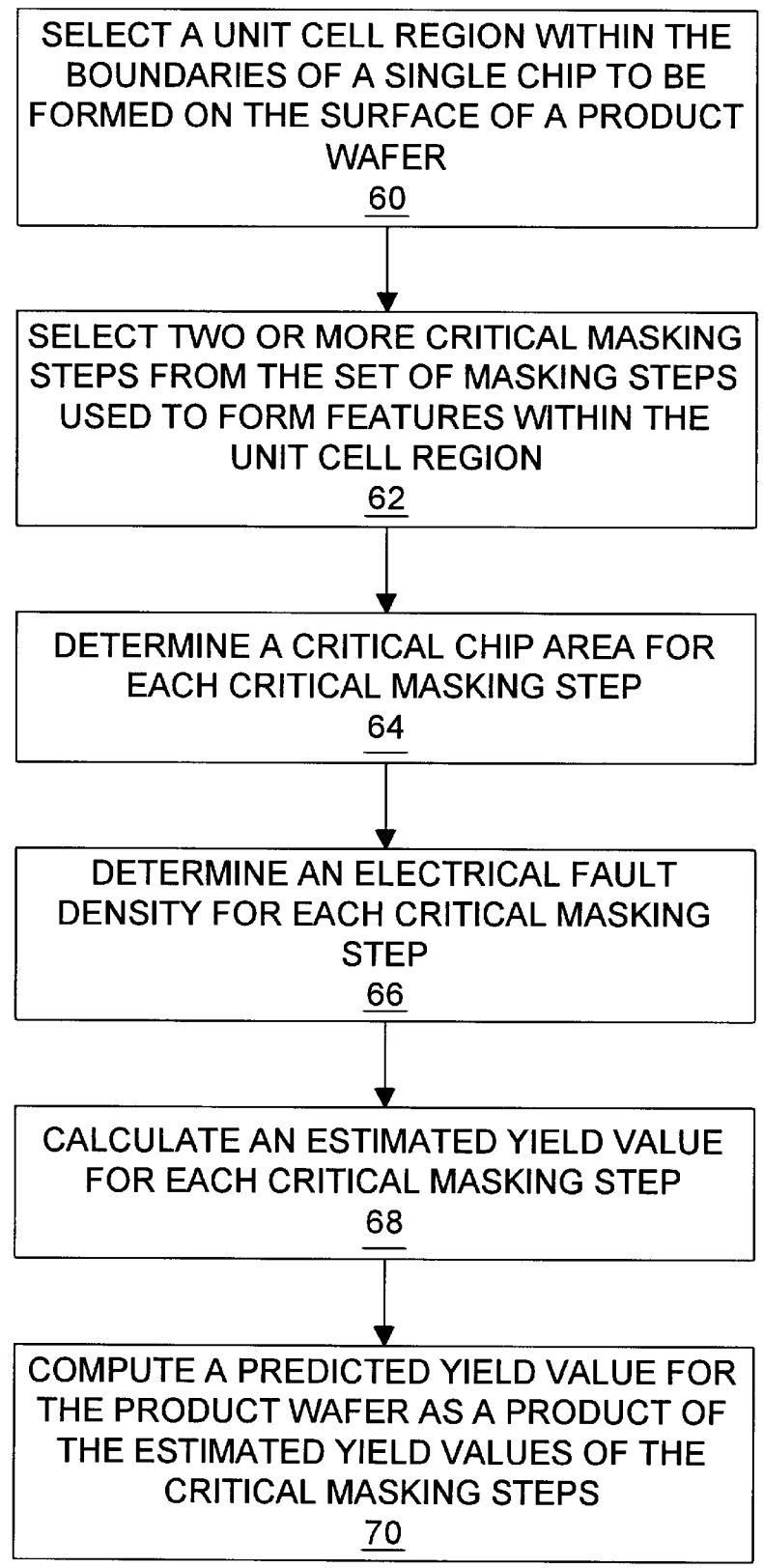
FIG. 11 is a flow chart of the present method of determining a predicted yield value for ia product wafer subjected to a wafer fabrication process.

FIG. 11 is a flow chart which will be used to summarize the present method of determining a predicted yield value for product wafers manufactured using a particular wafer fabrication process. During a first step 60, a unit cell region within the boundaries of a single chip is selected. As mentioned above, several masking steps preferably form features with minimum dimensions or spacings within the selected unit cell. The objective in this case is to obtain a yield prediction for product wafers manufactured using the wafer fabrication process which is conservative.

During a second step 62, two or more of the masking steps used to form features within the unit cell region are selected as critical masking steps. Critical masking steps typically form features with minimum dimensions or spacings within the unit cell region, and thus have a significant impact upon the predicted yield for product wafers manufactured using the wafer fabrication process.

A critical chip area is determined for each critical masking step during a step 64. Unit cell models are typically developed for each critical masking step, and each unit cell model is used to determine a corresponding chip critical area. As described above, a unit cell model represents that section of a mask used to form one or more features within the unit cell region during a critical masking step. Critical chip area A' for a given critical masking step may be calculated by: (i) identifying one or more critical regions of the corresponding unit cell model, (ii) determining the fraction of the unit cell model which is taken up by the one or more critical regions, and (iii) multiplying the fraction by chip area A. A set of criteria based upon the design rules for the process may are used to identify critical regions of the unit cell model. In general, critical areas exist where features formed during the masking step: (i) have the minimum physical dimension established for the masking step, or (ii) are separated by the minimum spacing distance established for the masking step. In some cases critical chip area A' may be estimated using information as to the fractions of a mask which are opaque and clear. The sum of the areas enveloped by the critical regions is used to determine a critical chip area A' for each masking step.

During a step 66, an electrical fault density is determined for each critical masking step. The electrical fault density D' for a critical masking step is computed as a product of an expected total defect density $D_t$ associated with the critical masking step and a factor expressing the fraction of defects which are expected to result in catastrophic failures $f_c$ as described above.

An estimated yield value is calculated for each critical masking step during a step 68. Critical chip area A' and electrical fault density D' for a given masking step are substituted into a yield prediction model equation to produce an estimated yield value for the masking step.

During a step 70, a predicted yield value for the product wafer manufactured using the wafer fabrication process is computed by multiplying the estimated yield values associated with the critical masking steps together. Thus the predicted yield value is a product of the estimated yield values associated with the critical masking steps.

It will be appreciated by those skilled in the art having the benefit of this disclosure that this invention is believed to be capable of determining a predicted yield value for a product wafer manufactured using a wafer fabrication process. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for determining a predicted yield value for a silicon wafer subjected to a wafer fabrication process, wherein the wafer fabrication process employs a plurality of masking steps in order to form a plurality of identical chips upon a surface of the silicon wafer, the method comprising:

selecting a first masking step from the plurality of masking steps, wherein the first masking step is used to pattern a previously deposited layer in order to form a plurality of features within a unit cell region upon the surface of the silicon wafer;

determining a first portion of the unit cell region within which the plurality of features formed have a minimum physical dimension;

determining a second portion of the unit cell region within which any two of the plurality of features formed are separated by a minimum physical distance;

summing an area enveloped by the first portion of the unit cell region and an area enveloped by the second portion of the unit cell region in order to determine a critical chip area;

dividing a total number of defects expected to be present within the previously deposited layer following the first masking step and a subsequent etch step by an area enveloped by the surface of the silicon wafer in order to determine a defect density;

determining a fraction of the total number of defects expected to be present within the previously deposited layer following the first masking step and the subsequent etch step and expected to render at least one of the plurality of chips inoperative;

multiplying the defect density by the fraction in order to determine an electrical fault density;

multiplying the critical chip area and the electrical fault density in order to determine a masking step yield value; and repeating the preceding steps for a second masking step in order to produce the predicted yield value.

2. The method as recited in claim 1, wherein each of the plurality of identical chips is delineated by physical boundaries, and the unit cell region is located within the physical boundaries of one of the plurality of identical chips.

3. The method as recited in claim 1, wherein a set of design rules for the wafer fabrication process specify the minimum physical dimension and the minimum spacing distance for each masking step.

4. The method as recited in claim 1, wherein the critical chip area is determined by summing the area enveloped by the first portion of the unit cell region and the area enveloped by the second portion of the unit cell region, dividing by an area enveloped by the unit cell region, and multiplying by an area enveloped by a single chip.

5. The method as recited in claim 1, wherein the total number of defects expected to be present within a previously deposited layer following a masking step and a subsequent etch step is derived from a plurality of historical particulate contaminant measurements associated with the masking step.

6. The method as recited in claim 1, wherein the fraction of the total number of defects present within the previously deposited layer following the first masking step is derived from a plurality of historical yield values associated with the first masking step.

7. The method as recited in claim 1, wherein the masking step yield value is derived by raising the base of the natural logarithms to the power of the negative square root of the product of the critical chip area and the electrical fault density.

8. The method as recited in claim 1, wherein the predicted yield value is produced by multiplying the yield value for the first masking step by the yield value for the second asking step.

9. A method for determining a predicted yield value for a silicon wafer subjected to a wafer fabrication process, wherein the wafer fabrication process employs a plurality of masking steps in order to form a plurality of identical chips upon a surface of the silicon wafer, the method comprising:

selecting a unit cell region upon the surface of the silicon wafer;

selecting a first and second masking steps from the plurality of masking steps, wherein the first and second masking steps are each used to pattern a previously deposited first and second layers, respectively, to form a plurality of features within the unit cell region;

determining for the first masking step a first portion of the unit cell region within which the plurality of features formed have a first minimum physical;

determining for the first masking step a second portion of the unit cell region within which any two of the plurality of features formed are separated by a first minimum spacing distance;

summing an area enveloped by the first portion of the unit cell region and an area enveloped by the second portion of the unit cell region in order to determine a critical chip area. for the first masking step;

dividing a total number of defects expected to be present within the previously deposited first layer following the first masking step and a subsequent first etch step by an area enveloped by the surface of the silicon wafer in order to determine a defect density for the first masking step;

determining a fraction of the total number of defects expected to be present within the previously deposited first layer following the first masking step and the subsequent first etch step and expected to render at least one of the plurality of chips inoperative;

multiplying the defect density by the fraction in order to determine an electrical fault density for the first masking step;

multiplying the critical chip area and the electrical fault density for the first masking step in order to determine a first masking step yield value;

determining for the second masking step a first portion of the unit cell region within which the plurality of features formed have a second minimum dimension;

determining for the second masking step a second portion of the unit cell region within which any two of the plurality of features formed are separated by a second minimum distance;

summing an area enveloped by the first portion of the unit cell region and an area enveloped by the second portion of the unit cell region in order to determine a critical chip area for the second masking step;

dividing a total number of defects expected to be present within the previously deposited second layer following the second masking step and a subsequent second etch step by the area enveloped by the surface of the silicon wafer in order to determine a defect density for the second masking step;

determining a fraction of the total number of defects expected to be present within the previously deposited second layer following the second masking step and the subsequent second etch step and expected to render at least one of the plurality of chips inoperative;

multiplying the defect density by the fraction in order to determine an electrical fault density for the second masking step;

multiplying the critical chip area and the electrical fault density for the second masking step in order to determine a second masking step yield value; and multiplying the first masking step yield value by the second masking step yield value in order to determine the predicted yield value.

10. The method as recited in claim 9, wherein each of the plurality of identical chips is delineated by physical boundaries, and the unit cell region is located within the physical boundaries of one of the plurality of identical chips.

11. The method as recited in claim 9, wherein a set of design rules for the wafer fabrication process specify the first minimum physical dimension and the first minimum spacing distance for the first masking step along with the second minimum physical dimension and the second minimum spacing distance for the second masking step.

12. The method as recited in claim 9, wherein the critical chip area for a masking step is determined by summing the area enveloped by the first portion of the unit cell region and the area enveloped by the second portion of the unit cell region for the masking step, dividing by an area enveloped by the unit cell region, and multiplying by an area enveloped by a single chip.

13. The method as recited in claim 9, wherein the total number of defects expected to be present within a previously deposited layer following a masking step and a subsequent etch step is derived from a plurality of historical particulate contaminant measurements associated with the masking step.

14. The method as recited in claim 9, wherein the fraction of the total number of defects expected to be present within a previously deposited layer following a masking step and a subsequent etch step and expected to render one or more of the plurality of chips inoperative is derived from a plurality of historical yield values associated with the masking step.

* * * * *

UNITED STATES PATENT AND TRADEMARK OFFICE
CERTIFICATE OF CORRECTION

PATENT NO. : 5,773,315

DATED : June 30, 1998

INVENTOR(S) : Richard W. Jarvis

It is certified that error appears in the above-identified patent and that said Letters Patent is hereby corrected as shown below:

Claim 1, col. 19, line 58, please delete the word "physical" and insert therefor --spacing--.

Claim 8, col. 20, line 45, please delete the word "asking" and insert therefor --masking--.

Claim 9, col. 20, line 61, please insert the word --dimension-- after the phrase "minimum physical".

Claim 9, col. 21, line 22, please insert the word --physical-- after the phrase "second minimum" before the word "dimension".

Claim 9, col. 21, line 26, please insert the word --spacing-- after the phrase "second minimum" before the word "distance".

Signed and Sealed this

Seventeenth Day of November, 1998

Attest:

BRUCE LEHMAN

Attesting Officer

Commissioner of Patents and Trademarks